United States Patent [19]

Stierlin

[11] Patent Number: 5,304,920

[45] Date of Patent: Apr. 19, 1994

[54] OPTICAL CURRENT TRANSFORMER

[75] Inventor: Roland Stierlin, Gränichen, Switzerland

[73] Assignee: Asea Brown Boveri Ltd., Baden, Switzerland

[21] Appl. No.: 766,325

[22] Filed: Sep. 27, 1991

[30] Foreign Application Priority Data

Sep. 28, 1990 [EP] European Pat. Off. ........ 90118643.7

[51] Int. Cl.$^5$ ............................................. G01R 31/00
[52] U.S. Cl. .................... 324/96; 324/117 R
[58] Field of Search ................ 324/117 R, 96, 244, 324/244.1, 158 R; 356/350, 368; 359/245; 250/225

[56] References Cited

U.S. PATENT DOCUMENTS

| | | | |
|---|---|---|---|
| 4,539,519 | 9/1985 | Ulrich et al. | 324/117 R |
| 4,745,357 | 5/1988 | Miller | 324/96 |
| 4,797,607 | 1/1989 | Dupraz | 324/96 |
| 4,823,083 | 4/1989 | Meunier et al. | 324/244.1 |
| 4,899,042 | 2/1990 | Falk et al. | 324/96 |
| 5,029,273 | 7/1991 | Jaeger | 324/96 |
| 5,051,577 | 9/1991 | Lutz et al. | 324/96 |
| 5,202,629 | 4/1993 | Seike et al. | 324/96 |

FOREIGN PATENT DOCUMENTS

0088419 9/1983 European Pat. Off.

OTHER PUBLICATIONS

International Journal of Optoelectronics Band 3, Nr. 5, 1988, pp. 391–407, A. J. Rogers: "Optical-Fibre Current Measurement".

Journal of Lightwave Technology, Band LT-4, Nr. 10, Oct. 1986, pp. 1580–1593. New York, N.Y. US. A. Brandenburg: "Stress in Ion-Exchanged Glass Waveguides".

F&M Feinwerktechnik & Messtechnik Band 97, Nr. 10, Oct. 1989, pp. 415–421, Munchen, DE.

Applied Optics, vol. 19, No. 22, Nov. 15, 1980, pp. 3729–3734. A. Papp and H. Harms: "Magnetooptical Current Transformer Principles".

Applied Optics, vol. 19, No. 22, Nov. 15, 1980, pp. 3735–3740 H. Aulich, et al.: "Magnetooptical Crurent Transformer Components".

Applied Optics, vol. 19, No. 22, Nov. 15, 1980, pp. 3741–3744 H. Harms and A. Papp: "Magnetooptical Crurent Transformer Measurements".

IEEE Proceedings, vol. 135, Pt. J No. 5, Oct. 1988, pp. 372–383 S. Donati, et al.: "Magneto-optical fibre sensors for electrical industry: analysis of performances".

Westinghouse ABB Power T&D Co. Electric Metering Systems MOCT Technical Documentation Summary Raleigh, N.C. "A New Generation of Current Sensing", Apr. 1989.

Bodenseewerk Geratetechnik GmbH, D-7770 Oberlingen Germany pp. 7.0–7.15. "Waveguide Ring Resonators in Glass for Optical Gyros" W. Bernard et al.

Journal of Lightwave Technology, vol. LT-2, No. 5, Oct. 1984 "Characteristics of an Integrated Optics Ring Resonator Fabricated in Glass" Kazuo Honda et al.

*Primary Examiner*—Vinh Nguyen
*Attorney, Agent, or Firm*—Oblon, Spivak, McClelland, Maier & Neustadt

[57] ABSTRACT

In an optical current transformer in which the Faraday rotation of light in a waveguide (2) enclosing the current is measured, the waveguide (2) is designed as an integrated-optics single-mode waveguide embedded in a substrate (1).

Further elements of the measuring device, such as polarizers (13), mirrors (11) and Y couplers (12, 14), may likewise advantageously be integrated into the substrate (1).

The integration leads to a sensor element (SE) which can be produced in a simple manner and is to a large extent insensitive to environmental influences such as temperature fluctuations and vibrations.

17 Claims, 3 Drawing Sheets

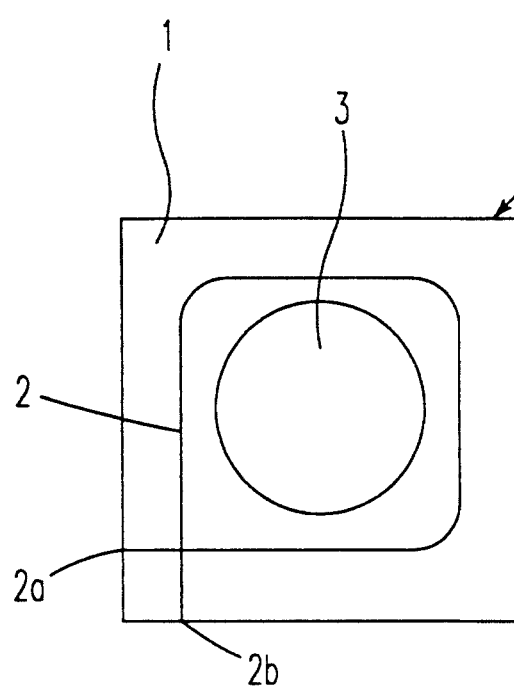
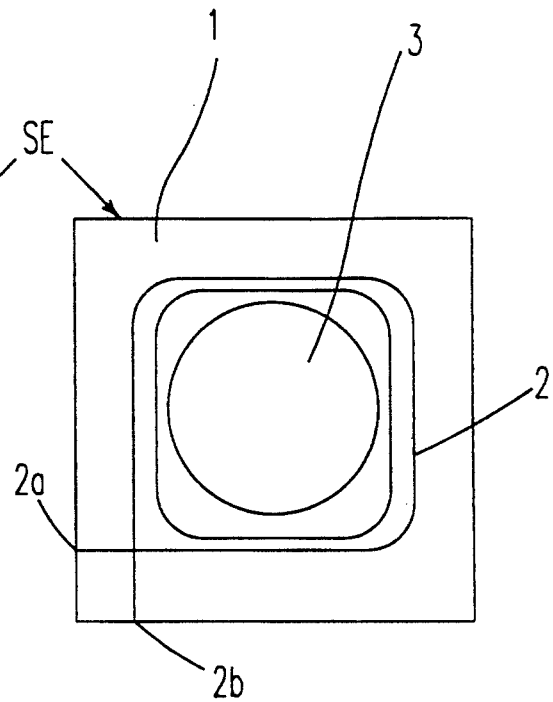
*FIG. 1A*  *FIG. 1B*
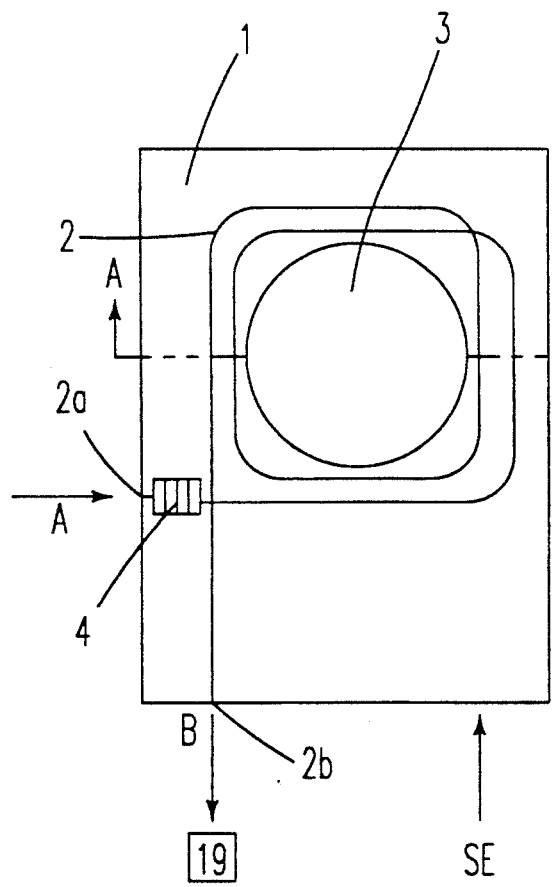
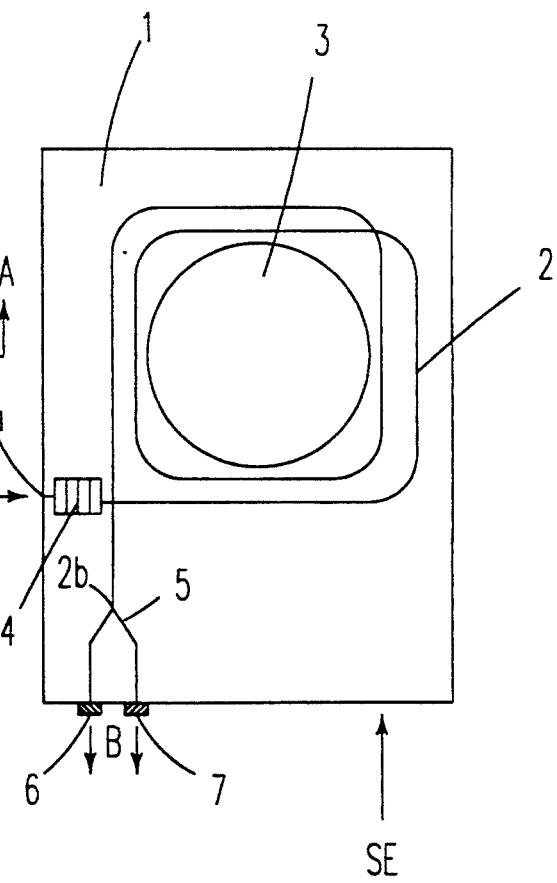
*FIG. 2A*  *FIG. 2B*

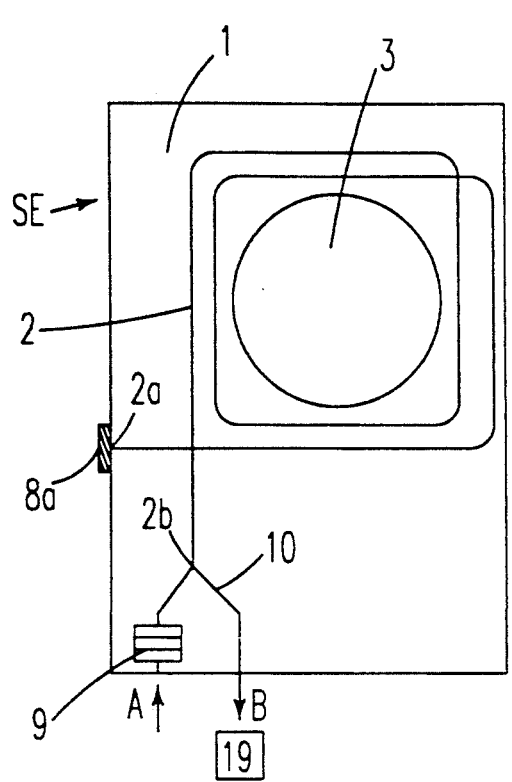
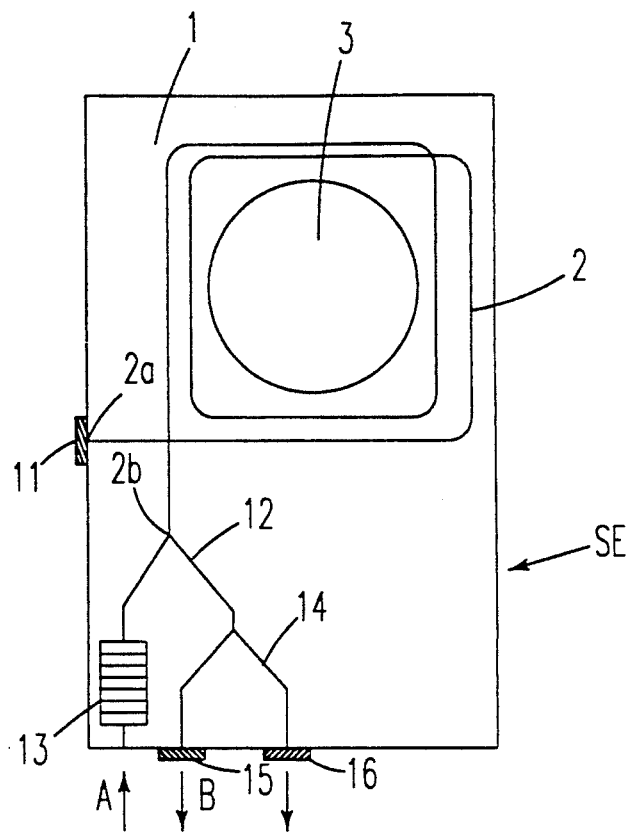
*FIG. 3A*  *FIG. 3B*
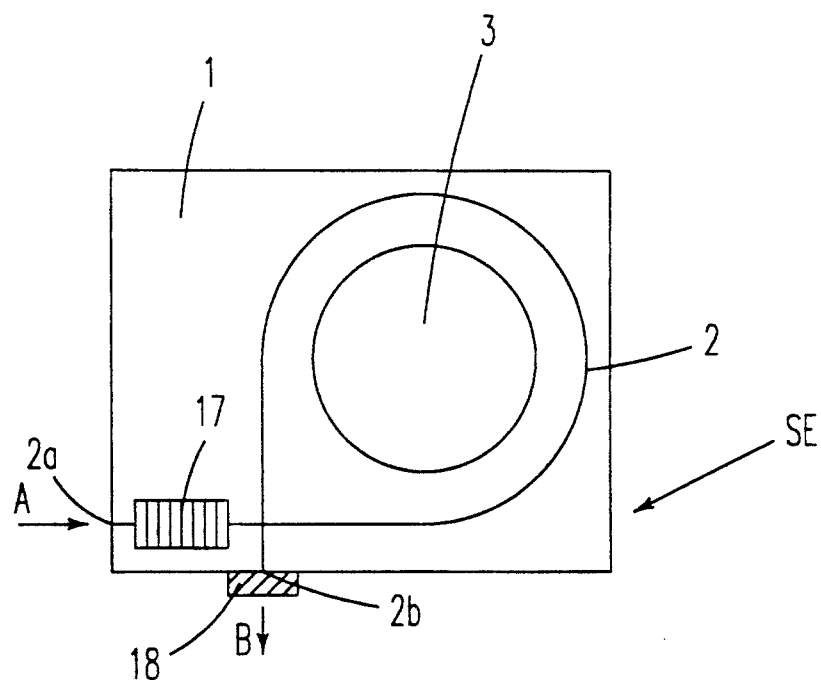
*FIG. 4*

OPTICAL CURRENT TRANSFORMER

BACKGROUND OF THE INVENTION

1. Field of the Invention

The present invention relates to the field of current measurement technology. It concerns an optical current transformer which makes use of the Faraday effect for the purpose of measuring a current, comprising
  (a) a sensor element having an optical entrance for coupling in light and at least one optical exit for coupling out the light;
  (b) within the sensor element, an annular waveguide which encloses the current to be measured and is optically connected to the optical entrance and the at least one optical exit; and
  (c) means for measuring the magneto-optical rotation of the plane of polarization of the light in the waveguide.

Such a current transformer is known, for example, from DE-A1-3,116,149.

2. Discussion of Background

Optical current transformers which make use of the Faraday effect in a suitable material, especially a glass fiber, for the purpose of measuring the current, are known from a multiplicity of publications. By way of representative examples, reference is made in this connection to the following publications:

"Magnetooptical current transformer. 1: Principles", A. Papp et al., Appl. Optics 19 (1980), pp. 3729-3734;

"Magnetooptical current transformer. 2: Components", H. Aulich et al., Appl. Optics 19 (1980), pp. 3735-3740;

"Magnetooptical current transformer. 3: Measurement", H. Harms et al., Appl. Optics 19 (1980), pp. 3741-3745; and "Magneto-optical fiber sensors for electrical industry: analysis of performances", S. Donati et al., IEE Proc. 135 (1988), pp. 372-382.

In this connection, there are in the prior art various current transformer concepts which differ principally in the nature of the design of the sensor element or sensor head. In many cases, the sensor element consists of a glass fiber wound up in the manner of a coil (see the abovementioned publications). In other cases, the sensor is designed as a compact glass block which encloses the current path and in the interior diverts the light by means of mirror-coated corners around the current path (in this connection, see: "A new generation of current sensing", MOCT Technical Documentation Summary, Westinghouse ABB Power T+D Company, Electric Metering Systems, Raleigh, April 1989).

Various methods are employed for the evaluation of the measurement signal: one of these is the one-polarizer method, in which a single polarizer is disposed at the exit of the sensor for the analysis of the polarization (in this connection, see FIG. 1 of DE-A1-3,116,149). On the other hand, use is however also made of the polarimetric detection method, in which the polarization components in two mutually orthogonal directions are determined in a polarimetric detection unit (in this connection, see FIG. 3 of the above cited article by S. Donati et al.).

The earlier current sensors have the disadvantage either that they react sensitively (as in the case of wound glass fibers) to external disturbances of the waveguide, such as for example vibrations, change of temperature, mechanical pressure on the fiber, bending of the fiber, or that they are onerous and costly in production (as in the case of the mirror-coated glass block).

SUMMARY OF THE INVENTION

The object of the present invention is to provide an optical current transformer which is insensitive to environmental influences (temperature fluctuations, vibration etc..), has small dimensions and can be produced in a simple manner.

With a transformer of the initially mentioned type, this object is achieved in that
  (d) the sensor element comprises a flat substrate with a continuous opening, situated at the center, for the current to be measured;
  (e) the waveguide is designed as an integrated-optics single-mode waveguide embedded in the substrate; and
  (f) the waveguide encloses the opening in at least one winding.

The core of the invention cossists in designing the waveguide as a line embedded in a substrate. As a result of this integration in a solid substrate, mechanical stresses are avoided, since the waveguide is permanently and securely fixed and, above all, does not need to be bent. Over and above this, further optical elements (mirrors, polarizers, couplers etc) can advantageously be integrated into the substrate, so that a compact, robust sensor is obtained.

A first preferred illustrative embodiment of the invention is distinguished in that
  (a) the substrate consists of a glass; and
  (b) the waveguide has been generated by exchange of ions in the glass.

This method of integration has already been employed successfully in the production of resonators for gyroscopes and accordingly gives reproducible results.

A sensor with particularly low birefringence is obtained if, according to a further illustrative embodiment of the invention, the substrate is provided with an additional covering on the side of the embedded waveguide.

Further illustrative embodiments are evident from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings (in top plan view in each instance) wherein, FIGS. 1a, b show two basic embodiments of a sensor element according to the invention with one winding (a) or a plurality of windings (b) of the waveguide;

FIG. 2a shows a first illustrative embodiment of a sensor element according to the invention, having a waveguide operated in radiation transmission mode, an integrated polarizer at the entrance, and a polarimetric detection unit following the exit;

FIG. 2b shows a second illustrative embodiment of a sensor element according to the invention, having a waveguide operated in radiation transmission mode, an integrated polarizer at the entrance, and an integrated grated Y coupler with downstream, mutually orthogonal polarizers at the exit;

FIG. 2c is a cross-sectional view of the substrate and embedded waveguide of the present invention taken along the lines A—A of FIG. 2a;

FIG. 3a shows a third illustrative embodiment of a sensor element according to the invention, having a waveguide operated in reflection mode, an integrated Y coupler, an integrated polarizer at the entrance and a polarimetric detection unit following the exit;

FIG. 3b shows a fourth illustrative embodiment of a sensor element according to the invention, having a waveguide operated in reflection mode, two integrated Y couplers and an integrated polarizer; and FIG. 4 shows a fifth illustrative embodiment of a sensor element according to the invention, having a waveguide operated in radiation transmission mode, an integrated polarizer at the entrance and an individual polarizer at the exit.

DESCRIPTION OF THE PREFERRED EMBODIMENTS

Figure 2C:
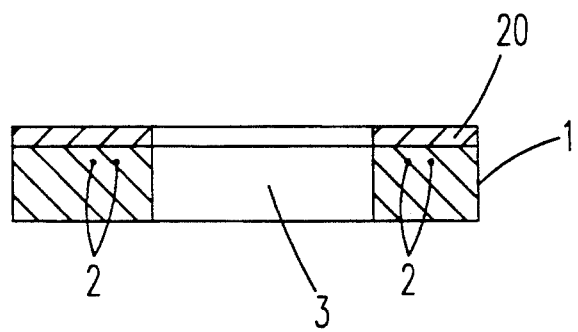

Referring now to the drawings, wherein like reference numerals designate identical or corresponding parts throughout the several views, in FIGS. 1a and 1b two basic embodiments of a sensor element according to the invention are reproduced in plan view. The sensor element SE consists essentially of a flat substrate 1 having a continuous opening 3 disposed at the center. In use, the current to be measured is passed through this opening 3.

Around the opening 3 extends a waveguide 2, which entirely encloses the opening 3 in one (FIG. 1a) or a plurality (FIG. 1b) of windings. The waveguide 2 exhibits two waveguide ends 2a and 2b, at which, depending upon the particular type of measurement and evaluation method, light can be coupled in and coupled out or reflected.

An important particular feature of the waveguide 2, which feature cannot be explicitly recognized in the figures, now consists in that what is involved in this case is an integrated-optics (io) waveguide, which has been produced by embedding in the substrate 1. The embedded io waveguide 2 preferably exhibits a birefringence (DB) of $DB < 10^{-5}$, especially of $DB < 10^{-6}$.

The literature does indeed contain reports on the production and properties of integrated-optics annular waveguides in glass. However, these ring structures are exclusively designed as resonators, e.g. for use in optical gyroscopes (in this connection, see: "Characteristics of an integrated optics ring resonator fabricated in glass", K. Honda et al., IEEE J. of Lightwave Technology LT-2 (1984), pp. 714–719; and "Waveguide ring resonators in glass for optical gyros", W. Bernhard et al., Proc. DGON (1986), pp. 7.0–7.15).

By the optimization of glasses and of the production process, it has furthermore proved to be possible to produce embedded single mode waveguides which exhibit a birefringence of $DB \leq 10^{-4}$ (the accuracy of measurement is $\pm 10^{-4}$; in this connection, see: "Integrated Optics in Glass", L. Ross, MIOP 1988).

It is on the other hand known from the theory of optical current sensors that in the case of this application the birefringence along the light path around the current-carrying guide must not be excessively large (in this connection, see: "Optical-fiber current measurement", A. J. Rogers, Int. J. of Optoelectronics 3 (1988), pp. 391–407).

To date, no consideration has been given to the idea of using such embedded waveguides in a current sensor which operates in accordance with the principle of the Faraday effect, since a birefringence in the waveguide of $DB \leq 10^{-6}$ is required for this purpose.

Internal measurements under the auspices of the applicant have now revealed that the birefringence DB in embedded io single mode waveguides is small ($DB \approx 10^{-5}$). By appropriate measures (see below), it can be further reduced to $DB \leq 10^{-6}$. With waveguides the birefringence of which is less than $DB \approx 10^{-6}$, it is possible to form annular waveguides which are very suitable for an optical current measurement by means of the Faraday effect.

In this case, the substrate 1 preferably consists of a glass in which the waveguide 2 has been generated by exchange of ions. Within this exchange, specified ions of the original glass are replaced by other ions which alter the atomic glass structure and the refractive index.

By way of example, for the substrate 1 a glass is used which contains $SiO_2$, $B_2O_3$, $Al_2O_3$, $Na_2O$ and $F^-$, with an $Na_2O$ proportion of 12.5 mol %, and which is commercially available in particular for example from the company Schott (Mainz), under the name BGG 31. The waveguide 2 is then generated by replacing $Na^+$ ions in the glass by $Ag^+$ ions.

The critical birefringence of the io waveguide 2 becomes particularly low if the substrate 1 is provided, on the side of the embedded waveguide 2, with an additional, suitable covering 20, as shown in FIG. 2C. Preferably, the additional covering 20 consists of a plastic material coating, or it is formed by a further glass substrate which has been adhesively bonded, vaporized or sprayed onto the substrate 2. In this case, it is important that the refractive index of the covering 20 is equal to the refractive index of the substrate 2 or somewhat smaller.

The critical birefringence of the io waveguide 2 also becomes particularly low if the ellipticity (mask width) and the depth of embedding of the waveguide are coordinated with one another so that the geometric birefringence associated therewith compensates the stress-induced birefringence.

The current transformer becomes particularly compact and robust if, in addition, the means for the measurement of the magneto optical rotation are at least partially integrated into the sensor element (SE).

While in FIGS. 1a and b only the basic form of a sensor element SE according to the invention has been reproduced, FIGS. 2 to 4 show embodiments of sensor elements SE with additional, integrated elements for the measurement of the Faraday effect in the waveguide 2. Each one of these sensor elements SE exhibits an optical entrance A for coupling in the light and at least one optical exit B for coupling out the light. In this case, the coupling in can take place for example via an input glass fiber or a semiconductor light source directly coupled on.

In the embodiments according to FIGS. 2a and b as well as FIG. 4, one end 2a of the waveguide forms directly the optical entrance A of the sensor element SE. At this one waveguide end 2a, preferably behind the optical entrance A, there is disposed a first polarizer 4 or 17 which is integrated into the substrate 1 and which linearly polarizes the light entering into the optical entrance A.

The linearly polarized light then runs, in the waveguide 2, around the opening 3, through which the current to be measured flows. At the other waveguide end 2b the rotation of the plane of polarization which is caused by the current is analyzed and measured.

This measurement can take place in that the other waveguide end 2b is directly connected to only one optical exit B and the light from this optical exit B is passed over into a separate, conventional polarimetric detection unit 19 (FIG. 2a).

However, the measurement can also be performed in such a manner that the other waveguide end 2b is connected to two optical exits B via an exit-side Y coupler 5 integrated into the substrate 1. At the two optical exits B there are then disposed a second and third polarizer 6 and 7 respectively, which are set with their plane of polarization orthogonal to one another and rotated through ±45° in relation to the first polarizer 4. The optical power at the two exits B is measured behind the polarizers 6 and 7 either directly or via two glass fibers (FIG. 2b).

Finally, the measurement can also take place in that the other waveguide end 2b is directly connected to only one optical exit B and the light at this optical exit B is sent through a second polarizer 18, the plane of polarization of which is rotated through 45° in relation to the first polarizer 17 (FIG. 4; one-polarizer method). In this case, the second polarizer 18 can be (as shown in the figure) a discrete element, or integrated into the substrate 1 in place of the first polarizer 17.

In the embodiments according to FIGS. 3a and 3b, the rotation of the plane of polarization is measured in reflection. For this purpose, one of the waveguide ends 2a is provided with a mirror 8 or 11. The other waveguide end 2b is connected via an entrance-side Y coupler 10 or 12, integrated into the substrate 1, to the optical entrance A and the at least one optical exit B.

In both cases, in one of the branches of the entrance-side Y coupler 10 or 12 behind the optical entrance A there may be disposed a first polarizer 9 or 13, which is integrated into the substrate 1 and which—as in the case of the sensor elements according to FIGS. 2a, 2b and 4—linearly polarizes the light coupled in.

In the embodiment according to FIG. 3a, only one optical exit B is present, which is connected to the other branch of the entrance-side Y coupler 10. After the light has passed through the waveguide 2 in both directions, it can there be coupled out and again passed to an external polarimetric detection unit 19; alternatively, however, a further polarizer is disposed at the exit B, which further polarizer stands at 45° to the first polarizer 9 and the one-polarizer method is employed.

In the embodiment according to FIG. 3b, two optical exits B are present. The other branch of the entrance-side Y coupler 12 is optically connected to these two optical exits B via an exit-side Y coupler 14 integrated into the substrate 1. In this instance, the reflected light is coupled out in the entrance-side Y coupler 12, split up into two components in the exit-side Y coupler 14 and analyzed by means of a second and third polarizer 15 and 16 respectively, which are disposed orthogonally to one another and rotated through ±45° in relation to the first polarizer 13, at the two optical exits B.

The integrated Y couplers 5, 10, 12 and 14 which are employed in all embodiments can be constructed in the same technology as the waveguide 2 itself, i.e. by ion exchange in the glass substrate. The mirrors required in the case of the sensor elements operating in reflection (FIGS. 3a and b) can be constructed in that the waveguide 2 is passed to the edge of the substrate 1 and there a mirror is for example vaporized on or adhesively bonded on (mirror 8 in FIG. 3b). If this is not possible or not expedient, a mirror can also be constructed by a reflection grating or by etching in or drilling a depression into the substrate 1.

The embodiments of the sensor element SE according to FIGS. 2a up to and including FIG. 4 can also be employed as optical resonators. In this case, the entrance-side, first polarizer 4, 9, 13 or 17 is omitted. The optical entrance A and the optical exit B are both mirror-coated (mirror coating <100%). A sensor element SE modified in this manner then replaces the glass fiber helix resonator in the measuring arrangements according to European Patent Application EP-A1-0,356,670.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. An optical current transformer which makes use of the Faraday effect for the purpose of measuring an externally generated current, comprising:

a flat substrate having an opening situated at a center of said substrate, said opening provided for passing the current to be measured, said substrate further including an optical entrance (A) for coupling in light and at least one optical exit (B) for coupling light out, an integrated-optics polarizer embedded into the substrate and coupled to the optical entrance, an annular waveguide which encloses the opening and therefore the current to be measured and has a first end optically coupled to the optical entrance via said polarizer and a second end optically coupled to at least one optical exit, said waveguide designed as an integrated-optics single-mode waveguide monolithically embedded in the substrate and surrounding the opening in at least one winding; and means coupled to said optical exit for measuring the magneto-optical rotation of the plane of polarization of the light in the waveguide.

2. The optical current transformer as claimed in claim 1, wherein the waveguide exhibits a birefringence of $DB \leq 10^{-6}$.

3. The optical current transformer as claimed in claim 2, wherein
   (a) the substrate consists of a glass; and
   (b) the waveguide has been generated by the exchange of ions in the glass.

4. The optical current transformer as claimed in claim 3, wherein
   (a) the glass of the substrate contains $SiO_2$, $B_2O_3$, $Al_2O_3$, $Na_2O$ and $F^-$, with an $Na_2O$ proportion of 12.5 mol %; and
   (b) the waveguide has been generated by replacing $Na^+$ ions in the glass by $Ag^+$ ions.

5. The optical current transformer as claimed in claim 3, wherein in order to reduce the birefringence the substrate is provided with an additional covering on the side of the embedded waveguide.

6. The optical current transformer as claimed in claim 5, wherein the additional covering consists of a plastic material coating, or is formed by a further glass substrate which has been adhesively bonded, vaporized or sprayed onto the substrate.

7. The optical current transformer as claimed in claim 3, wherein the ellipticity and the depth of embedding of the waveguide are coordinated with one another so that the geometric birefringence associated therewith compensates the stress-induced birefringence.

8. The optical current transformer as claimed in claim 1, wherein the means for the measurement of the magneto optical rotation are at least partially integrated into the substrate.

9. The optical current transformer as claimed in claim 1, wherein
only one optical exit (B) is present; and
the second waveguide end is directly optically connected to the one optical exit (B).

10. The optical current transformer as claimed in claim 9, wherein
(a) the means for the measurement of the magneto optical rotation of the plane of polarization comprise a polarimetric detection unit; and
(b) the polarimetric detection unit is disposed behind the one optical exit (B).

11. The optical current transformer as claimed in claim 9, wherein
(a) the means for the measurement of the magneto optical rotation of the plane of polarization comprise a second polarizer;
(b) the second polarizer is rotated through 45° in relation to the first polarizer; and
(c) the second polarizer is disposed at the second waveguide end (2b).

12. The optical current transformer as claimed in claim 11, wherein the second polarizer is designed to be integrated into the substrate.

13. The optical current transformer as claimed in claim 1, wherein
two optical exits (B) are present;
the second waveguide end is optically coupled to the two optical exits (B) via an exit-side Y coupler integrated into the substrate;
the means for the measurement of the magneto optical rotation of the plane of polarization comprise second and third polarizers;
the second and third polarizers are disposed so as to be orthogonal to one another and rotated through ±45° in relation to the first polarizer, at the two optical exits (B).

14. The optical current transformer as claimed in claim 1, comprising:
a mirror provided at the second end of said waveguide; and
an entrance-side Y coupler integrated into the substrate and optically coupled to the first end of the waveguide, said Y coupler having a first branch coupled to said polarizer to receive light from the optical entrance via said first polarizer and a second branch coupled to the optical exit, said second branch coupling light reflected from said mirror to said optical exit.

15. The optical current transformer as claimed in claim 14, wherein
only one optical exit is present;
the second branch of the Y coupler is directly optically connected to the one optical exit;
the means for measurement of the magneto optical rotation of the plane of polarization comprise a polarimetric detection unit; and
the polarimetric detection unit is disposed behind the one optical exit.

16. The optical current transformer as claimed in claim 14, wherein
only one optical exit is present;
the second branch of the Y coupler is directly optically connected to the one optical exit;
the means for the measurement of the magneto optical rotation of the plane of polarization comprise a second polarizer; and
the second polarizer is rotated 45° in relation to the first polarizer and is disposed behind the one optical exit.

17. The optical current transformer as claimed in claim 14, wherein two optical exits are present, comprising:
an exit-side Y coupler integrated into the substrate and having first and second branches optically coupled to respective of said optical exits, wherein the second branch of the entrance-side Y coupler is optically connected to the two optical exits via said exit-side Y coupler and light reflected by said mirror at the second end of said waveguide is thereby reflected back through said waveguide through said second branch of said entrance-side Y coupler and through the first and second branches of said exit-side coupler to the two optical exits; and
said means for measurement of the magneto optical rotation of the plane of polarization comprising second and third polarizers disposed so as to be orthogonal to one another and rotated to ±45° in relation to the first polarizer, at the two optical exits.

* * * * *